US012494231B2

(12) United States Patent
Yan et al.

(10) Patent No.: US 12,494,231 B2
(45) Date of Patent: Dec. 9, 2025

(54) SEMICONDUCTOR DEVICE AND METHOD OF FABRICATING THE SAME

(71) Applicant: Fujian Jinhua Integrated Circuit Co., Ltd., Quanzhou (CN)

(72) Inventors: Yifei Yan, Quanzhou (CN); Huixian Lai, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 384 days.

(21) Appl. No.: 18/195,942

(22) Filed: May 11, 2023

(65) Prior Publication Data

US 2023/0282248 A1 Sep. 7, 2023

Related U.S. Application Data

(62) Division of application No. 17/387,992, filed on Jul. 28, 2021, now Pat. No. 11,688,433.

(30) Foreign Application Priority Data

Jun. 24, 2021 (CN) ......................... 202110704388.3
Jun. 24, 2021 (CN) ......................... 202121418739.6

(51) Int. Cl.

*G11C 5/06* (2006.01)
*H01L 21/762* (2006.01)
*H10B 12/00* (2023.01)

(52) U.S. Cl.

CPC ........ *G11C 5/063* (2013.01); *H01L 21/76224* (2013.01); *H10B 12/09* (2023.02); *H10B 12/34* (2023.02); *H10B 12/482* (2023.02); *H10B 12/485* (2023.02); *H10B 12/50* (2023.02); *H10B 12/315* (2023.02)

(58) Field of Classification Search

CPC ... G11C 5/063; H01L 21/76224; H10B 12/09; H10B 12/34; H10B 12/482; H10B 12/485; H10B 12/50; H10B 12/315

See application file for complete search history.

(56) References Cited

U.S. PATENT DOCUMENTS

2013/0328160 A1 12/2013 Ota
2020/0152584 A1* 5/2020 Sohn ........................ H01L 23/64
2022/0130828 A1* 4/2022 Yan ........................... G03F 1/36

FOREIGN PATENT DOCUMENTS

KR 10-2022-0085622 6/2022

* cited by examiner

*Primary Examiner* — Patricia D Valenzuela
(74) *Attorney, Agent, or Firm* — Winston Hsu

(57) ABSTRACT

The present disclosure relates to a semiconductor device and a fabricating method thereof, which includes a substrate and a plurality of word lines. The substrate includes a shallow trench isolation and an active structure defined by the shallow trench isolation and the active structure includes a first active area and a second active area. The first active area includes a plurality of active area units being parallel extended along a first direction, and the second active area is disposed outside a periphery of the first active area, to surround all of the active area units. The word lines are disposed in the substrate to intersect the active area units and the shallow trench isolation. The word lines includes first word lines arranged by a first pitch and at least one second word line arranged by a second pitch, and the second pitch is greater than the first pitch.

7 Claims, 9 Drawing Sheets

SEMICONDUCTOR DEVICE AND METHOD OF FABRICATING THE SAME

CROSS REFERENCE TO RELATED APPLICATIONS

This application is a division of U.S. application Ser. No. 17/387,992, filed on Jul. 28, 2021. The content of the application is incorporated herein by reference.

BACKGROUND OF THE INVENTION

1. Field of the Invention

The present disclosure generally relates to a semiconductor device and a method of fabricating the same, and more particularly, to a semiconductor device having active areas and shallow trench isolations, and a method of fabricating the same.

2. Description of the Prior Art

With the miniaturization of semiconductor devices and the complexity of integrated circuits, the size of elements is continuously shrinking and the structure is constantly changing. Therefore, maintaining the performance of small-sized semiconductor elements is the standard purpose of the present industry. In the semiconductor fabricating process, most of the active areas are defined on the substrate as a base element, and then, the required elements are further formed on the active areas. Generally, the active areas are plural patterns formed within the substrate through the photolithography and etching processes. However, due to the sized-shrinking requirements, the width of the active areas has been gradually reduced, and the pitch between the active areas has also been gradually reduced thereby, so that, the fabricating process of active areas encounters plenty limitations and challenges that fails to meet the practical product requirements.

SUMMARY OF THE INVENTION

One of the objectives of the present disclosure provides a semiconductor device, in which a relative greater pitch is arranged between an outer-side word line and other word lines adjacent thereto, and a relative smaller pitch is arranged between the inner-side word lines and other word lines adjacent thereto. Accordingly, the process window of the bit line contacts disposed at the outer side may be effectively improved, and also, the direct conduction between the bit lines and the word lines may be successfully avoided.

To achieve the purpose described above, one embodiment of the present disclosure provides a semiconductor device including a substrate, and a plurality of word lines. The substrate includes a shallow trench isolation and an active structure defined by the shallow trench isolation. The active structure includes a first active area and a second active area. The first active area includes a plurality of active area units parallel extended along a first direction, and the second active area is disposed outside a periphery of the first active area to surround all of the active area units. The word lines are disposed in the substrate, extending in a second direction to intersect with the active area units and the shallow trench isolation. The word lines includes a plurality of first word lines and at least one second word line, the first word lines are sequentially arranged along a third direction perpendicular to the second direction by a first pitch, the at least one second word line is arranged along the third direction by a second pitch, and the second pitch is greater than the first pitch.

To achieve the purpose described above, one embodiment of the present disclosure provides a semiconductor device including a substrate, and a plurality of word lines. The substrate includes a shallow trench isolation and an active structure defined by the shallow trench isolation. The active structure includes a first active area and a second active area. The first active area includes a plurality of active area units parallel extended along a first direction, and the second active area is disposed outside a periphery of the first active area to surround all of the active area units. The word lines are disposed in the substrate, and the word lines extend along a second direction to intersect with the active area units and the shallow trench isolation. The word lines includes a plurality of first word lines and at least one second word line, wherein a part of the active area units have one end directly in contact with the second word lines, and another end directly in contact with the second active area.

To achieve the purpose described above, one embodiment of the present disclosure provides a method of fabricating a semiconductor device including the following steps. Firstly, a substrate is provided and the substrate includes a shallow trench isolation and an active structure defined by the shallow trench isolation, wherein the active substrate further includes a first active area and a second active area. The first active area includes a plurality of active area units parallel extended along a first direction, and the second active area is disposed outside a periphery of the first active area to surround all of the active area units. Then, a plurality of word lines is formed in the substrate, extending in a second direction to intersect with the active area units and the shallow trench isolation. The word lines includes a plurality of first word lines and at least one second word line, the first word lines are sequentially arranged along a third direction perpendicular to the second direction by a first pitch, the at least one second word line is arranged along the third direction by a second pitch, and the second pitch is greater than the first pitch.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 7 are schematic diagrams illustrating a fabricating process of a semiconductor device according to a preferable embodiment in the present disclosure, wherein:

FIG. 1 is a schematic top view of a semiconductor device after forming an active structure and word lines;

FIG. 2 is a schematic cross-sectional view taken along a cross-line A-A' in FIG. 1;

FIG. 3 is a schematic top view of a semiconductor device after forming contact openings;

FIG. 4 is a schematic cross-sectional view taken along a cross-line A-A' in FIG. 3;

FIG. 5 is a schematic top view of a semiconductor device after forming bit lines and contacts;

FIG. 6 is a schematic cross-sectional view taken along a cross-line A-A' in FIG. 5; and FIG. 7 is a schematic cross-sectional view taken along a cross-line B-B' in FIG. 5.

FIGS. 8-9 are schematic diagrams illustrating a fabricating process of a semiconductor device according to another preferable embodiment in the present disclosure, wherein:

FIG. 8 is a schematic top view of a semiconductor device after forming contact openings; and FIG. 9 is a schematic cross-sectional view taken along a cross-line A-A' in FIG. 8.

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
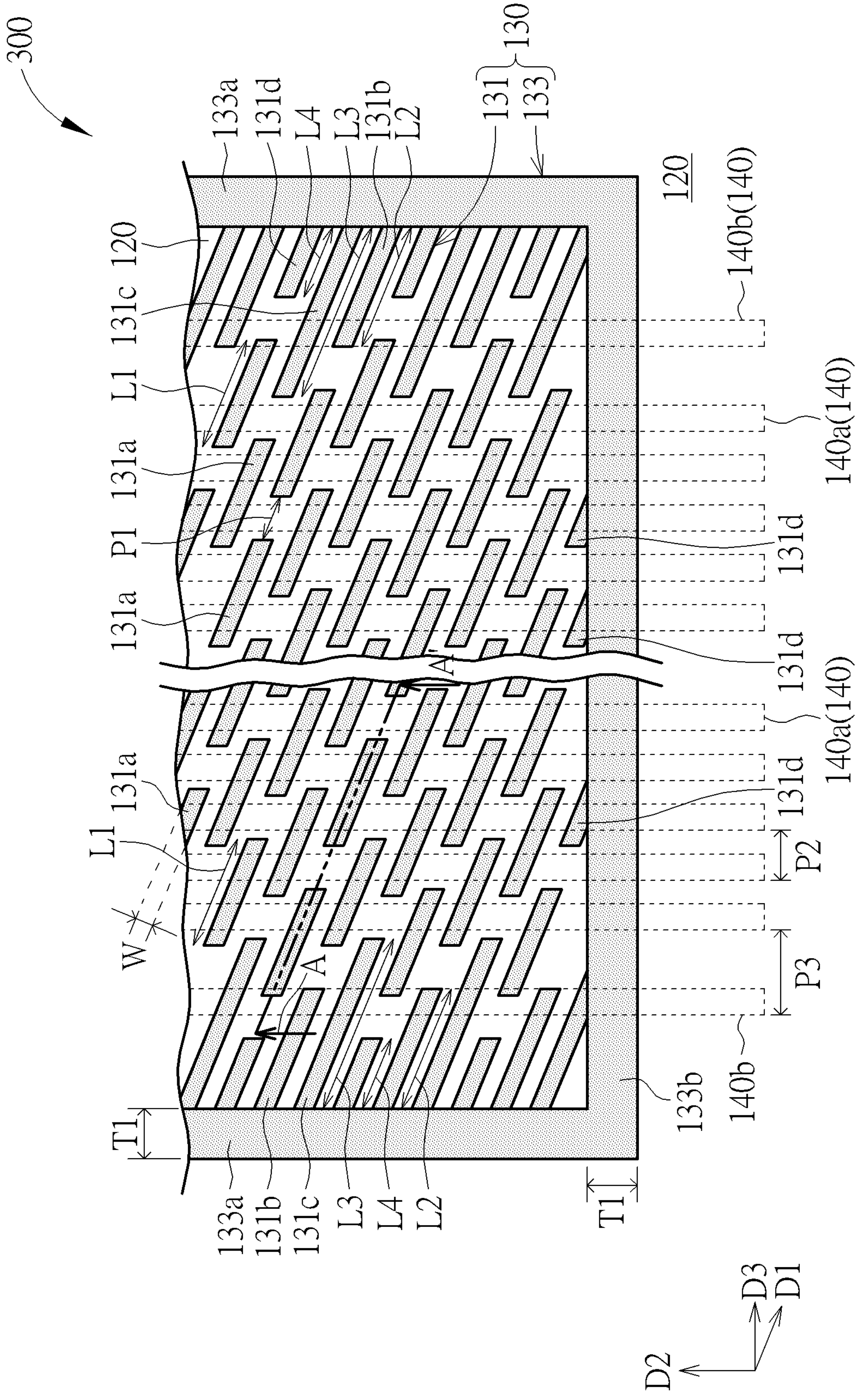
Figure 2:
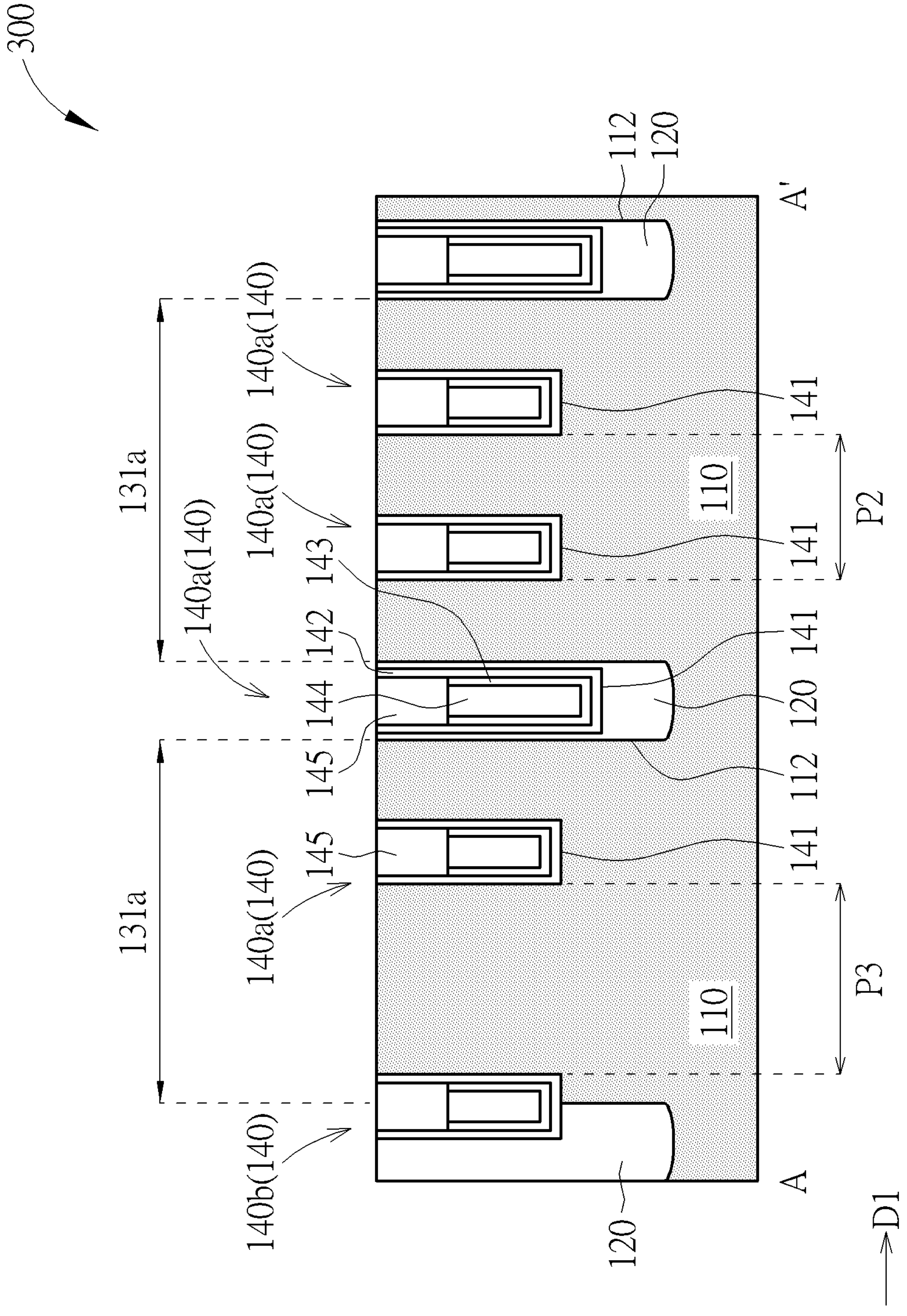
Figure 3:
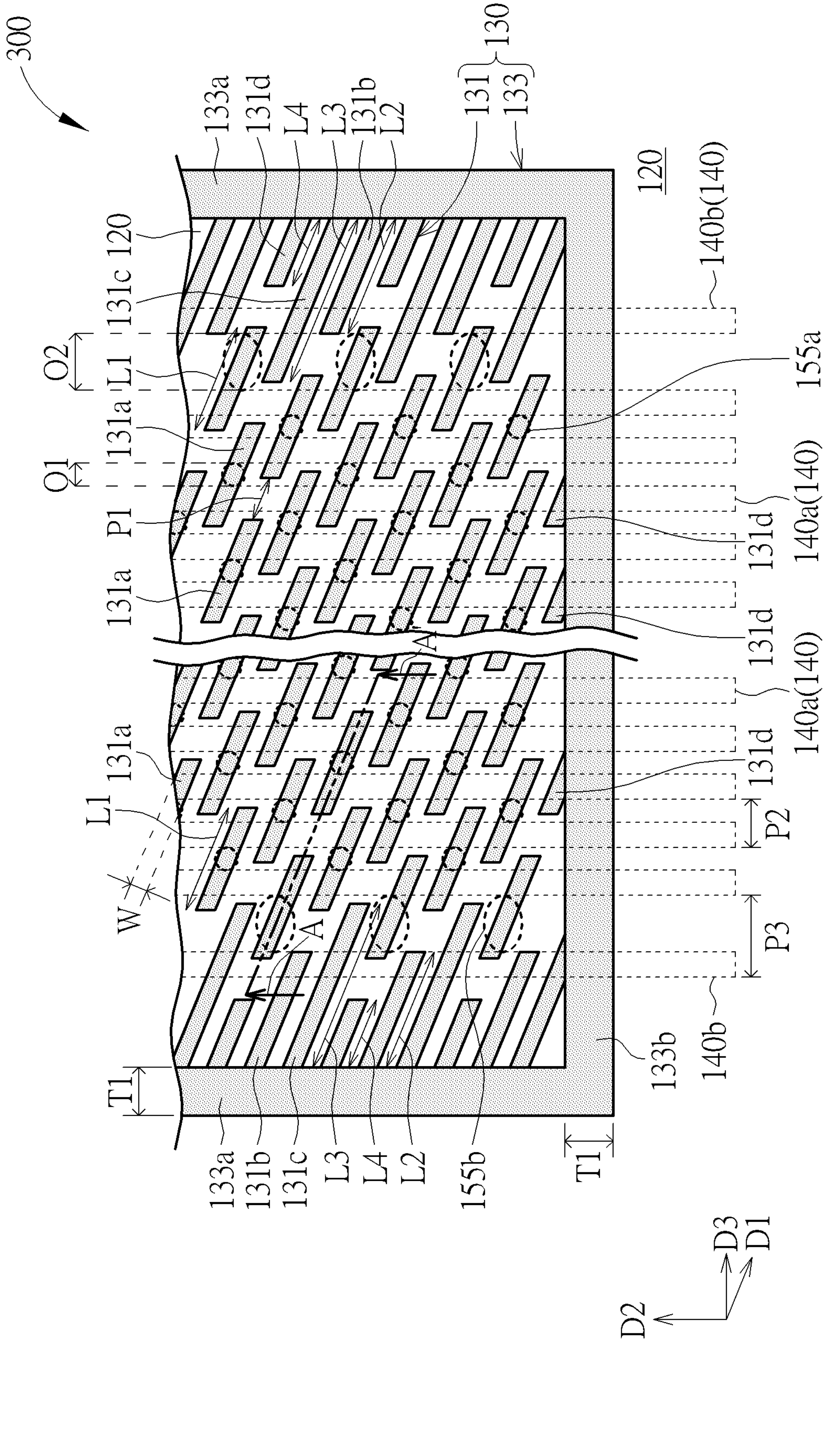
Figure 4:
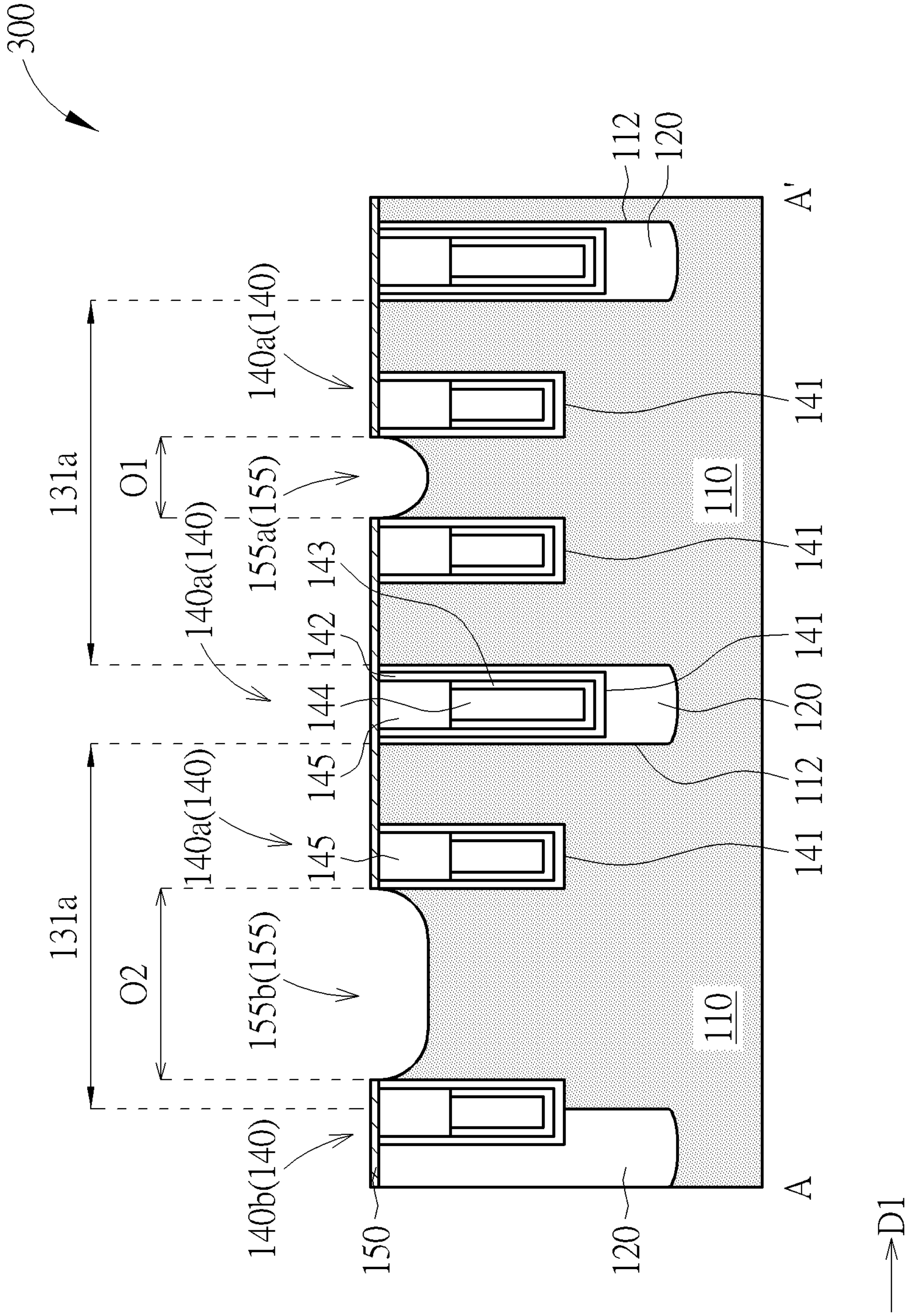
Figure 5:
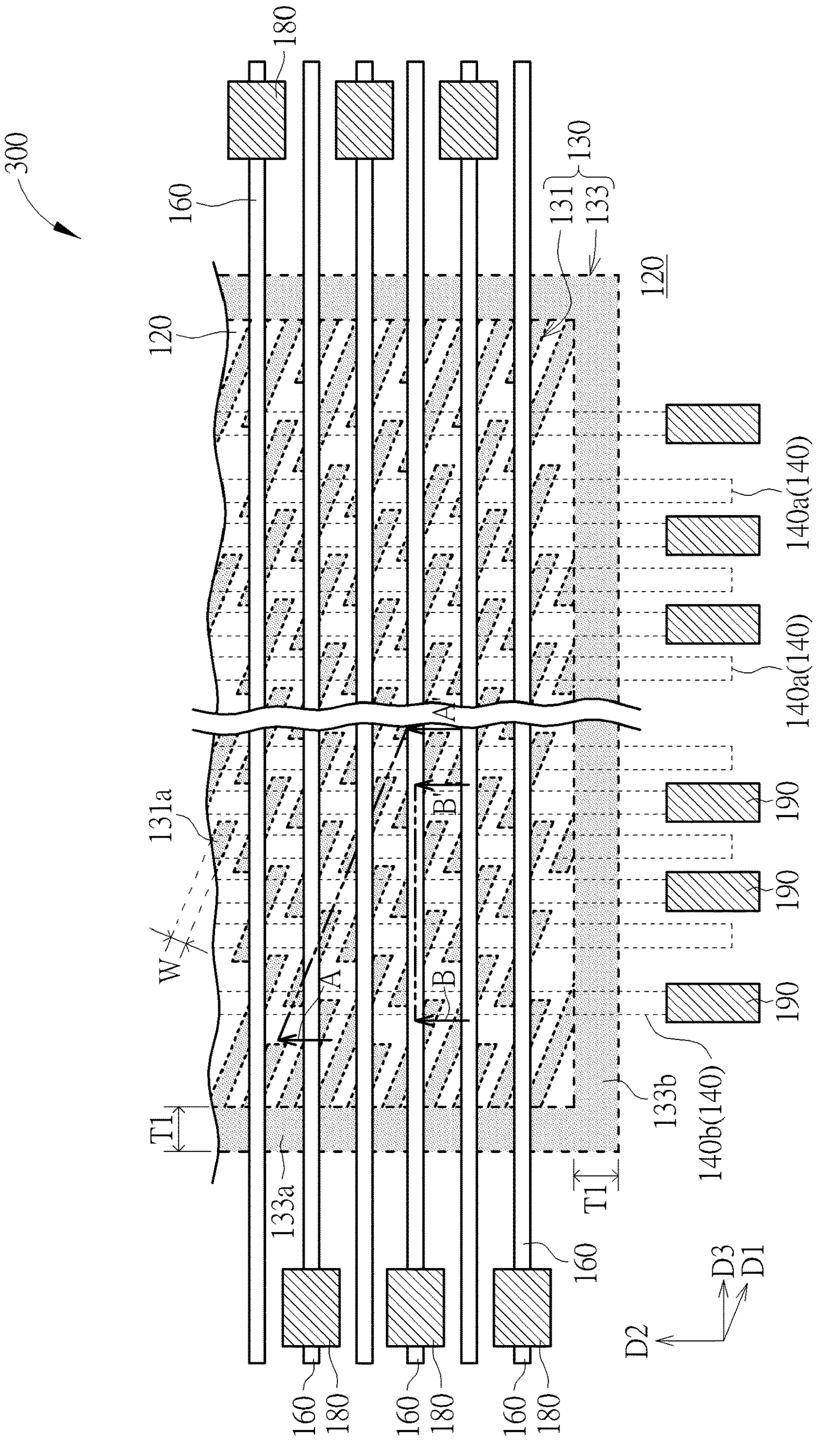

Please refer to FIGS. 1-7, which illustrate schematic diagrams of a fabricating process of a semiconductor device 300 according to the preferable embodiment in the present disclosure, with FIG. 1, FIG. 3 and FIG. 5 respectively illustrating a top view of the semiconductor device 300 at various stages of formation, and with FIG. 2, FIG. 4, FIG. 6, and FIG. 7 respectively illustrating a cross-sectional view of the semiconductor device 300 at various stages of formation. The semiconductor device 300 includes a substrate 110, for example a silicon substrate, a silicon containing substrate (such as SiC or SiGe), or a silicon-on-insulator (SOI) substrate, which includes at least one shallow trench isolation (STI) 120 disposed therein to define an active structure 130 in the substrate 110. That is, the shallow trench isolation 120 is disposed around the active structure 130. The active structure 130 further includes a first active area 131 disposed within a region (for example a region being highly integrity in the semiconductor device 300), and a second active area 133 disposed within another region (for example a periphery region being lower integrity in the semiconductor device 300). Preferably, the another region (for example the periphery region) is disposed outside the periphery of the region (for example the region), so that, the second active area 133 may be disposed around the periphery of the first active area 131, as shown in FIG. 1, but not limited thereto.

Please referring to FIG. 1 and FIG. 2, the first active area 131 further includes a plurality active area units 131*a*, 131*b*, 131*c*, 131*d* which is parallel and separately extended along a first direction D1 to alternately arrange with each other, wherein the first direction D1 is for example crossed and not perpendicular to the y-direction (such as a second direction D2) or the x-direction (such as a third direction D3). In one embodiment, each of the active area units 131*a* has the same length L1 in the first direction D1 and the same pitch P1 as well, to sequentially arrange along the first direction D1 into a plurality of rows, thereby presenting a particular arrangement, such as an array arrangement as shown in FIG. 1, but not limited thereto. The active area units 131*b*, 131*c*, 131*d* respectively have different lengths from the length L1, for example, being the lengths L2, L3, L4 respectively as shown in FIG. 1, wherein the length L4 may be smaller than the lengths L1, L2, L3, and the length L3 may be greater than the length L2, and the length L2 may be greater than the length L1 (L3>L2>L1>L4), but not limited thereto. Also, in the first direction D1, the active area units 131*a*, 131*b*, 131*c*, 131*d* are sequentially arranged by the same pitch P1 along the first direction D1 into a plurality of rows, with the active area units 131*b*, 131*c* and 131*d* being arranged by the same pitch P1 outside the periphery of all of the active area units 131*a*, such as being disposed at the left side, the bottom side, the right side, and the top side (not shown in the drawings) of all of the active area units 131*a*, to present a particular arrangement, such as an array arrangement as shown in FIG. 1, but not limited thereto.

In one embodiment, the formation of the first active area 131 may but not be limited to be accomplished through the following patterning process. For example, a mask layer (not shown in the drawings) may be firstly formed on the substrate 110, with the mask layer including plural patterns for defining the active area units 131*a*, 131*b*, 131*c*, 131*d* of the first active area 131 and with a portion of the substrate 110 being exposed form the mask layer, an etching process is then performed by using the mask layer, to remove the portion of the substrate 110 and to form at least one shallow trench 112, and an insulating material (not shown in the drawings) for example including silicon oxide ($Si0_x$), silicon nitride (SiN) or silicon oxiynitride (SiON) is formed to fill in the shallow trench 112, to form the shallow trench isolation 120 with coplanar surface with the top surface of the substrate 110, and to simultaneously define the first active area 131 in the substrate 110, as shown in FIG. 1 and FIG. 2. In one embodiment, the formation of the first active area 131 may also be accomplished by a self-aligned double patterning (SADP) process or a self-aligned reverse patterning (SARP) process, but not limited thereto.

Please referring to FIG. 1, the second active area 133 is disposed around the periphery of the first active area 131. In the present embodiment, the second active area 133 further includes at least two first edge 133*a* extended along the second direction D2, and at least one second edge 133*b* extended along the third direction D3. The first edges 133*a* are opposite to each other and are adjacent to the second edge 133*b* to arrange in sequence, such that, the whole second active area 133 may perform like a rectangular frame (not shown in the drawings) to directly in contact with the a part of the active area units 131*b*, 131*c*, 131*d*. In other words, while the second active area 133 is formed, the part of the active area units 131*b*, 131*c*, 131*d* may further connect to the first edge 133*a* and/or the second edge 133*b* of the second active area 133 directly, and another part of the active area units 131*a* may be spaced apart from the first edge 133*a* and/or the second edge 133*b* of the second active area 133, instead of being connected thereto, as shown in FIG. 1. Furthermore, the first edge 133*a* and the second edge 133*b* may include the same width T1, and the width T1 is preferably greater than the width W of each of the active area units 131*a*, 131*b*, 131*c*, 131*d*, but is not limited thereto. With these arrangements, the second active area 133 may be allowable to uniformly disperse the stresses suffered from the active area units 131*b*, 131*c*, 131*d* and the shallow trench isolation 120, thereby obtaining a further reliable structure. However, in another embodiment (not shown in the drawings), the second active area 133 may also not contact any active area units 131*a*, 131*b*, 131*c*, 131*d* at all optionally, or the width T1 of the second edge 133*b* and the first edge 133*a* may also be the same or smaller than the width W of the active area units 131*a*, based on practical product requirements. People in the art should fully realize that the practical disposing number of the first edge or the second edge may be further adjustable due to practical product requirements, or the second active area is not limited to be the aforementioned rectangular frame, for example, further edges may be additionally disposed to make the second active area to perform like various shapes.

It is noted that, in the present embodiment, the formation of the second active area 133 may also be accomplished through the patterning process of the substrate 110, and which may optionally be carried out together with the patterning process of the first active area 131. That is, in the present embodiment, the same or different mask layer(s) may be used to either simultaneously define or separately define the patterns of the first active area 131 and the second active area 133, followed by etching the substrate 110, and filling in the insulating material. Then, the first active area 131 and the second active area 133 may include the same material, namely the material of the substrate 110, and also, the first edge **133*a* and the second edges 133*b* of the second active area 133, and the active area units 131*b*, 131*c*, 131*d* which are connected with the first edge 133*a* and the second edges 133*b* may be monolithic, as shown in FIG. 1. In this situation, the active area units 131*b*, 131*c*, 131*d* of the first active area 131 which are connected to the first edge 133*a* or the second edges 133*b* of the second active area 133 may be serve as an inward extension of the first edge 133*a* and the second edges 133*b*, so that, the second active area 133 may obtain a relative stable, strengthened structure to protect the first active area 131, particular to the active area units 131*a*, disposed at the inner side thereof. Then, the possible structural collapse or damage of the active area units 131*a*** may be successfully avoided. However, people in the art should fully realize that the formation of the second active area is not limited to be accomplished through the aforementioned process, and may also be formed through other processes, for example being carried out separately from the formation of the first active area. As an example, in one embodiment, the fabricating process of the second active area may be performed before the fabricating process of the first active area, in which, the second active area may be formed firstly through the patterning process of the substrate, and the first active area is then formed by performing an epitaxial growth process (not shown in the drawings). Accordingly, the topmost surfaces of the second active area and first active area may not be leveled with each other. Otherwise, in another embodiment, the fabricating process of the second active area may also be performed after the fabricating process of the first active area, in which, the first active area is firstly formed through the patterning process of the substrate, and the second active area is then formed through a deposition process. Accordingly, the second active area and the first active area may include different materials, for example, the second active area may include polysilicon or a dielectric material which is different from that of the substrate.

Next, as shown in FIG. 1 and FIG. 2, a plurality of gate structure, preferably a plurality of buried gate structures 140, is formed in the substrate 110. In the present embodiment, a plurality of trenches 141 which is parallel with each other and extends along the second direction D2 is firstly formed in the substrate 110. Then, an interface dielectric layer 142 entirely covering surfaces of each of the trenches 141, a gate dielectric layer 143 covering bottom surfaces of each of the trenches 141, a gate electrode layer 144 filling up the bottom of each of the trenches 141, and a mask layer 145 filling up the top of each of the trenches 141, are sequentially formed in the trenches 141. Then, the topmost surface of the mask layer 145 may be coplanar with the top surface of the substrate 110, as shown in FIG. 2. Then, each of the buried gate structures 140 embedded in the substrate 110 may therefore function like a word line (WL) of the semiconductor device 300, wherein each word line is parallel with the first edge **133*a* of the second active area 133 to intersect with the active area units 131*a*, 131*b*, 131*c*, 131*d* and the shallow trench isolation 120 disposed between the active area units 131*a*, 131*b*, 131*c*, 131*d*, for receiving or transmitting voltage signals from each memory cell formed in the subsequent process (not shown in the drawings). It is noted that, the word lines (namely the buried gate structures 140) are sequentially arranged along the third direction D3, and further include a plurality of first word lines 140*a* and a plurality of second word lines 140*b*, wherein the first word lines 140*a* are sequentially arranged by a first pitch P2 along the third direction D3, and the second word lines 140*b* are arranged at two opposite sides of all of the first word lines 140*a* along the third direction D3 by a second pitch P3, and the second pitch P3 is greater that the first pitch P2, as shown in FIG. 1 and FIG. 2. In addition, it is noted that, the first word lines 140*a* pass through the middle portions of the active area units 131*a*, 131*d*, and the second word lines 140*b* pass through the middle portions of the active area units 131*c* and directly contact the end portions of the active area units 131*b*. In other words, a part of the active area units 131*b* directly contact the second word lines 140*b* through one end thereof, and directly contact the first edge 133*a* of the second active area 133 through another end thereof, as shown in FIG. 1**.

Next, as shown FIG. 3 (in which an insulating layer 150 is omitted) and FIG. 4, the insulating layer 150 is formed on the top surface of the substrate 110, to entirely cover the substrate 110 and to directly contact the buried gate structures 140 and the shallow trench isolation 120 disposed in the substrate 110. The insulating layer 150 for example includes an oxide-nitride-oxide (ONO) structure, but is not limited thereto. Then, an etching process is performed to remove a portion of the insulating layer 150 and a portion of the substrate 110 underneath, to form a plurality of contact openings 155 in the substrate 110, with each of the contact openings 155 being formed between two adjacent ones of the word lines (namely the buried gate structures 140) to partially expose the substrate 110. Precisely speaking, the contact openings 155 further include at least one first contact opening **155*a* and at least one second contact opening 155*b*, wherein the first contact opening 155*a* is disposed on the active area unit 131*a*, between two adjacent ones of the first word lines 140*a*, and the second contact openings 155*b* is also disposed on the active area unit 131*a*, between adjacent ones of the first word lines 140*a* and the second word lines 140*b*. That is, neither the first contact opening 155*a*, nor the second contact opening 155*b* is disposed on the active area units 131*b*, 131*c*, 131*d* which are further connected to the second active area 133, as shown in FIG. 3. Also, the first contact opening 155*a* includes an aperture O1 in the first direction D1, and the second contact opening 155*b* includes an aperture O2 in the first direction D1. It is noted that, since the pitch P3 of the second word lines 140*b* is relative greater, the aperture O2 of the second contact opening 155*b* may also be greater than the aperture O1 of the first contact opening 155*a*, as shown in FIG. 3. In other words, the arranged pitch P3 of the second word lines 140*b* may correspondingly enlarge the process window of the second contact opening 155*b***.

Figure 6:
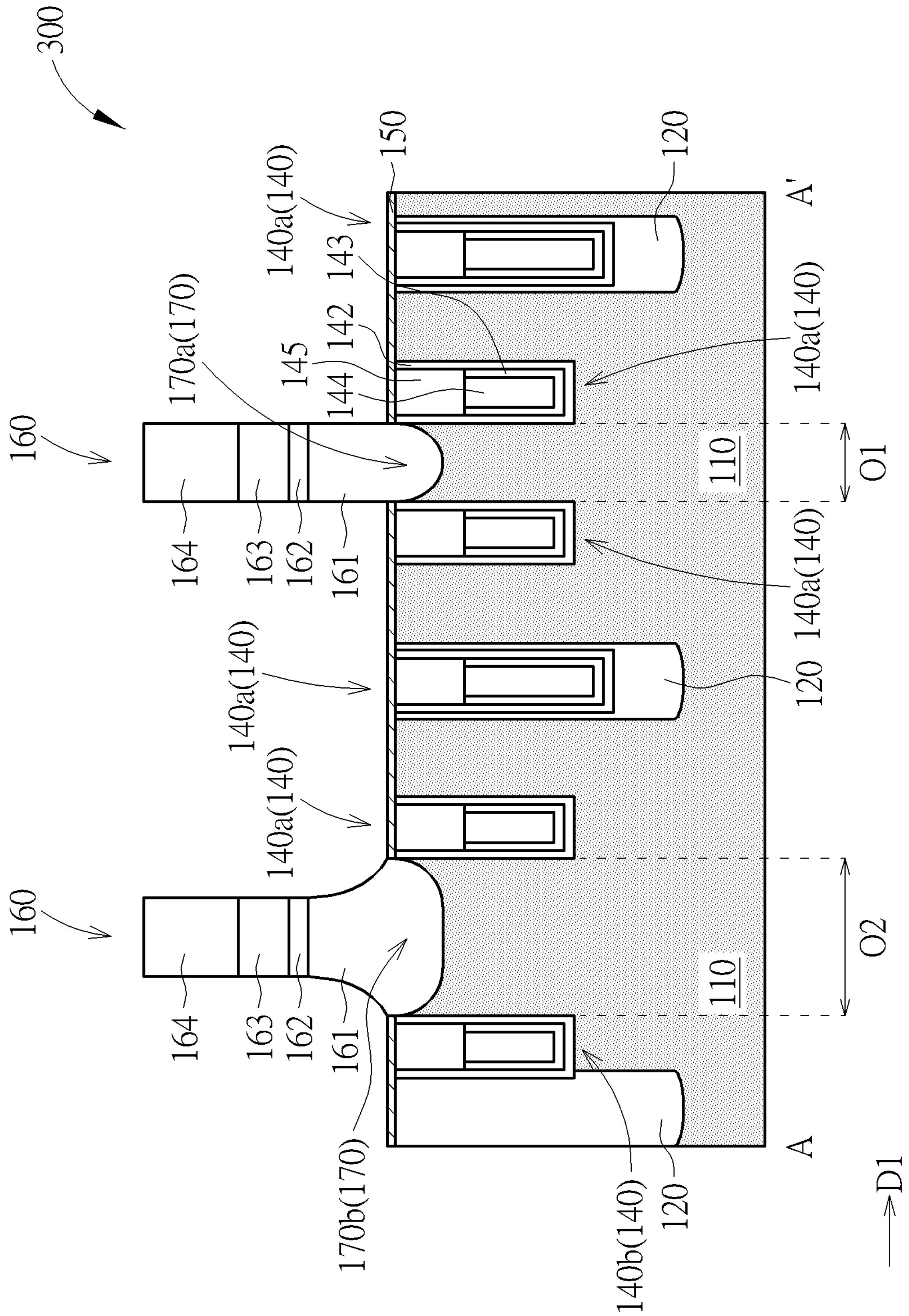
Figure 7:
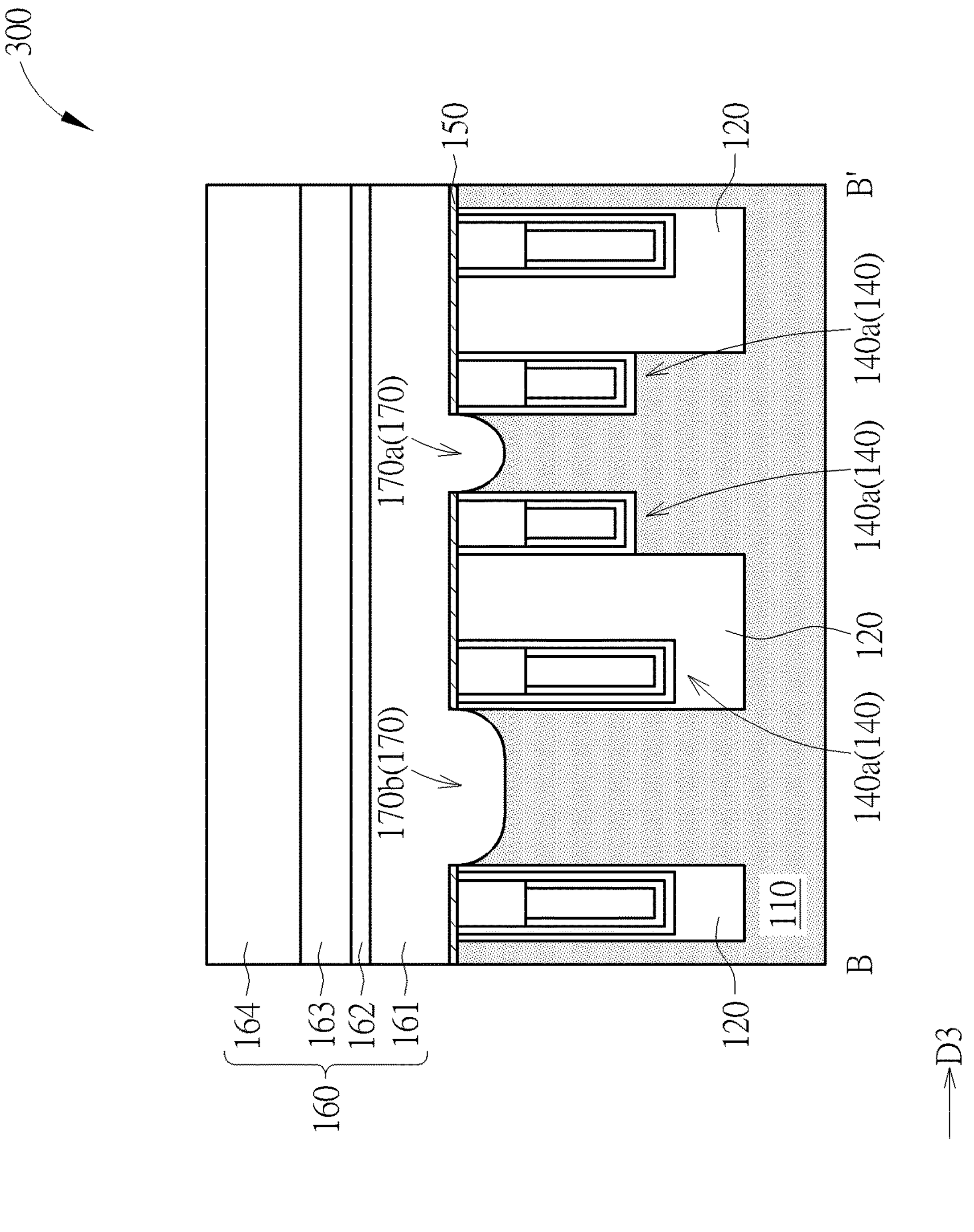

Following these, at least a bit line (BL) 160 is formed on the substrate 110. As shown in FIG. 5 to FIG. 7, a plurality of bit lines 160 is formed in the present embodiment, wherein each of the bit lines 160 is parallel and separately extended along the third direction D3 to intersect the word lines (namely the buried gate structures 140) and the active area units **131*a*, 131*b*, 131*c*, 131*d*. Each of the bit lines further includes a semiconductor layer 161**, a barrier layer 162, a conductive layer 163, and a mask layer 164 sequentially stacked from bottom to top on the insulating layer 150, with the semiconductor layer 161 for example including polysilicon, with the barrier layer 162 for example including titanium (T1) or titanium nitride (TiN), with the conductive layer 163 for example including a low resistant metal like tungsten (W), aluminum (Al) or copper (Cu), and with the mask layer 154 for example including silicon oxide, silicon nitride, or silicon oxynitride, but not limited thereto. Among them, a part of the bit lines 160 may be overlapped with the contact openings 155, so that, a portion of the semiconductor layer 161 may be filled in the contact openings 155 to form the contacts 170, to serve as bit line contacts (BLCs) thereby. With these arrangements, the bit line contacts (namely the contacts 170) are integrally formed with the bit lines 160 as shown in FIG. 7, and directly contact a part of the active area units 131*a*, so as to electrically connect to a transistor element (not shown in the drawings) disposed in the substrate 110 for receiving or transmitting voltage signals from each of the memory cells formed in the subsequent processes. It is noted that, in other to clearly present the bit lines 160, the contacts 170 are not illustrated in FIG. 5, and the specific locations of the contacts 170 may be referred to the locations of the contact openings 155 shown in FIG. 3. Precisely speaking, the contacts 170 further includes at least one first contact 170*a* and at least one second contact 170*b*, the first contact 170*a* is disposed on the active area unit 131*a*, between two adjacent ones of the first word lines 140*a*, and the second contact 170*b* is also disposed on the active area unit 131*a*, between adjacent ones of the first word lines 140*a* and the second word lines 140*b*. That is, the contacts 170 (including the first contact 170*a* and the second contact 170*b*) are not disposed on the active area units 131*b*, 131*c*, 131*d* which are further connected to the second active area 133, and which will not contact thereto. Accordingly, the first contact 170*a* may have a relative smaller width O1 in the first direction D1, and the second contact 170*b* may have a relative greater width O2 in the first direction D1 due to the arranged greater pitch P3 of the second word lines 140*b*, as shown in FIG. 6 and FIG. 7.

Then, as shown in FIG. 5, a plurality of contacts 180, 190 is formed on the bit lines 160 and the word lines (namely the buried gate structures 140) respectively, wherein the contacts 180 are alternately disposed at two ends (not shown in the drawings, for example referring to the right end and the left end of the bit lines 160 as shown in FIG. 5) of the bit lines 160, to electrically connect thereto. For example, the contacts 180 may be disposed on the right ends of the odd-numbered bit lines 160 and on the left ends of the even-numbered bit lines 160, as shown in FIG. 5, but is not limited thereto. On the other hand, the contacts 190 may also be disposed in the same or similar manner of the contacts 180, for example, the contacts 190 may be disposed on the bottom ends of the odd-numbered word lines (namely, the buried gate structures 140) and on the top ends (not shown in the drawings) of the even-numbered word lines (namely, the buried gate structures 140), but are not limited thereto. With such arrangements, the contacts 180, 190 may obtain enough process windows, and which may electrically connect the bit lines 160 and the word lines (namely, the buried gate structure 140) respectively through the end portions of the bit lines 160 and the word lines.

Through the aforementioned arrangements, the semiconductor device 300 accordingly to the preferred embodiment is completed. the semiconductor device 300 includes the second active area 133 disposed around the periphery of the first active area 131, with a part of the active area units 131*b*, 131*c*, 131*d* being further connected to the first edge 133*a* and/or the second edge 133*b* of the second active area 133, so as to disperse the stresses suffered from the shallow trench isolation 120, thereby obtaining a further reliable structure. Moreover, the semiconductor device 300 includes the word lines (namely the buried gate structures 140) arranged by different pitches, with a relative greater pitch P3 being arranged between the outer-side word line 140*b* and the word line 140*a* adjacent thereto, and with a relative smaller pitch P2 being arranged between the inner-side word lines 140*a* and the word lines 140*a* adjacent thereto. Accordingly, the contact 170*a* disposed between two adjacent ones of the word lines 140*a* may correspondingly obtain a relative smaller width O1, and the contact 170*b* disposed between adjacent ones of the word lines 140*a*, 140*b* may correspondingly obtain a relative greater width O2, so as to improve the process window of the bit line contacts (namely, the contact 170*a*) disposed at the outer side, and to avoid the direct conduction between the bit lines and the word lines. Based on these arrangements, the semiconductor device 300 of the present disclosure may gain better functions and performances thereby.

However, people in the art should fully realize that the semiconductor device and the fabricating method thereof are not be limited to aforementioned embodiment and may include other examples or may be achieved through other strategies to meet practical product requirements. For example, in one embodiment, the etching conditions may be further adjusted during the patterning process of the second active area to form the second active area with rounding corners, or to form the second active area with plural openings disposed thereon for further dispersing stresses, but not limited thereto.

Figure 8:
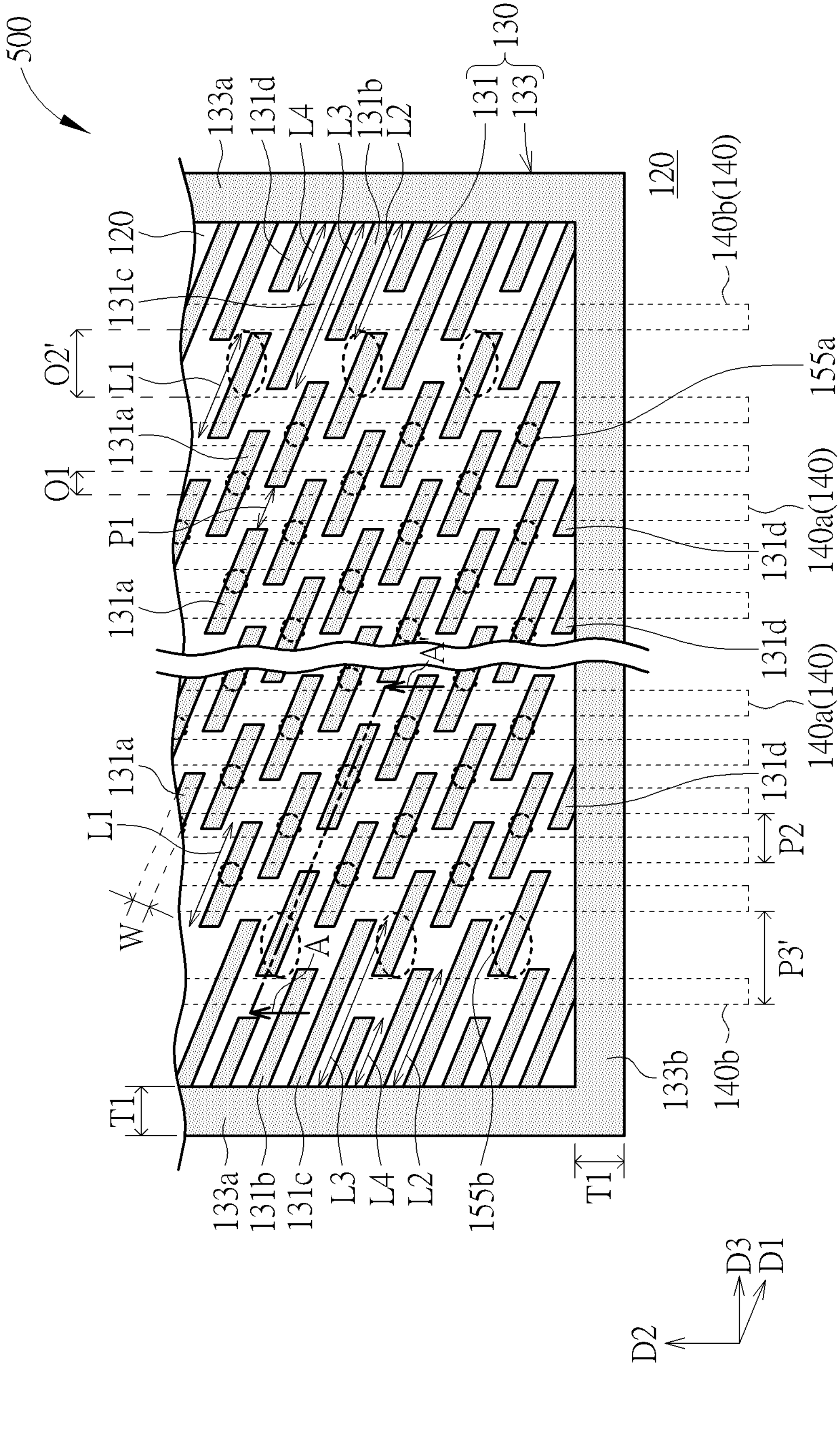
Figure 9:
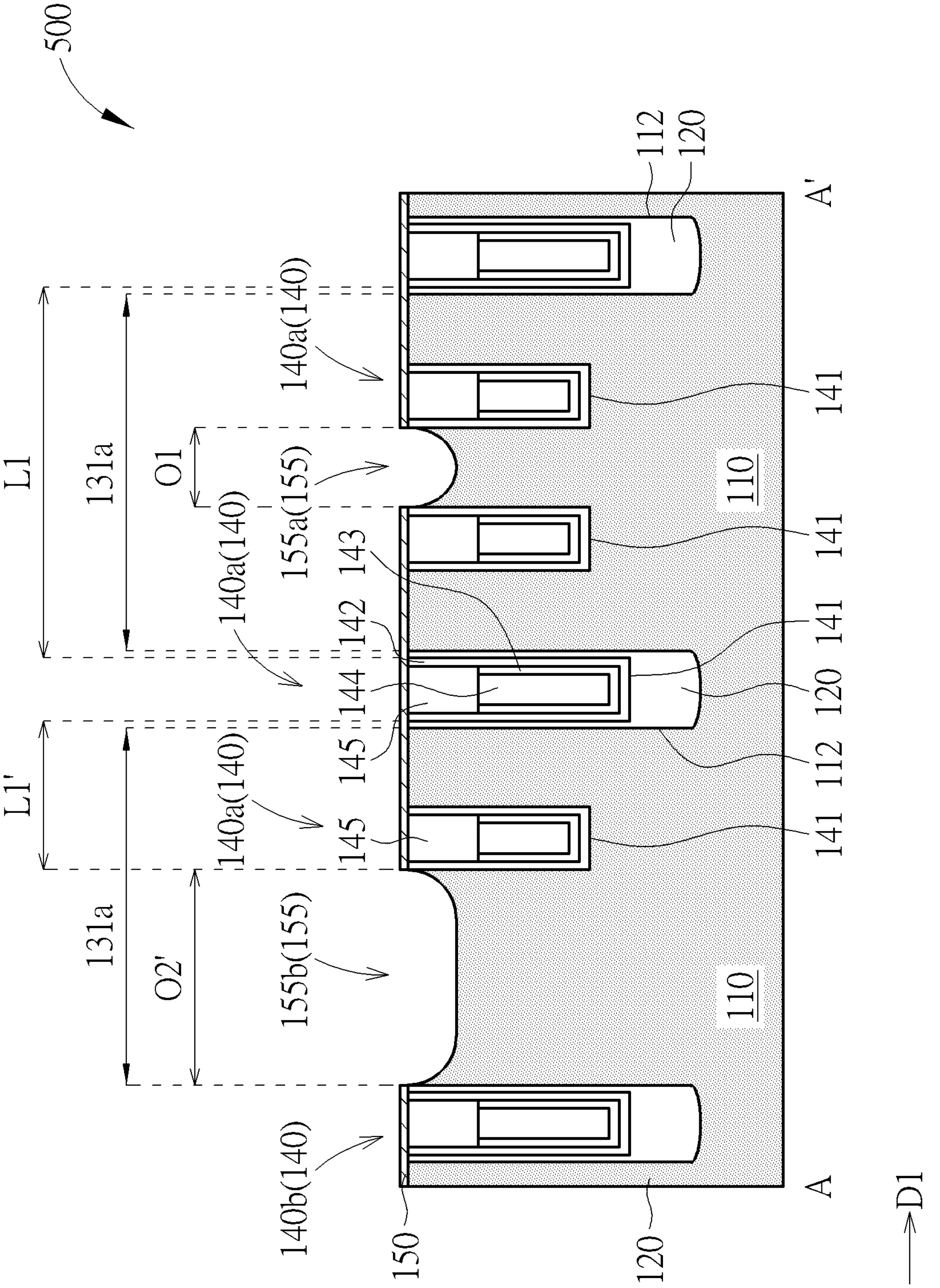

Furthermore, in another embodiment as shown in FIGS. 8-9, the pitch P3' of the second word lines 140*b* in third direction D3 may be further enlarged, and the second word lines 140*b* may only pass through the middle portions of the active area units 131*b*, 131*c* without contacting to any of the active area units 131*a*. Accordingly, since the pitch P3' of the second word lines 140*b* is further enlarged, the aperture O2' of the second contact opening 155*b* may be enlarged laterally, with the sidewall of the second contact opening 155*b* being vertically aligned with the end portion of the active area unit 131*a*, as shown in FIGS. 8-9. In other word, while forming the contact openings 155, a great portion of the active area unit 131*a* is removed for forming the second contact openings 155*b*, and the remained portion of the active area unit 131*a* may therefore obtain a reduced length L1' as shown in FIG. 9. Through these arrangements, the second word lines 140*b* may function like dummy word lines to protect the inner-side first word lines 140*a*, and also, the process window of the bit line contacts formed subsequently may be further improved. Then, the semiconductor device 500 of the present disclosure may gain better functions and performances thereby.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor device, comprising:

providing a substrate comprising a shallow trench isolation and an active structure defined by the shallow trench isolation, the active structure comprising:

a first active area comprising a plurality of active area units being parallel extended along a first direction; and a second active area disposed outside a periphery of the first active area, to surround all of the active area units; and forming a plurality of word lines in the substrate, the word lines extended along a second direction to intersect with the active area units and the shallow trench isolation, wherein the word lines comprise a plurality of first word lines and at least one second word line, from a top view of the semiconductor device, the first word lines are sequentially arranged along a third direction perpendicular to the second direction by a first pitch, the at least one second word line is arranged along the third direction by a second pitch, and the second pitch is greater than the first pitch.

2. The method of fabricating a semiconductor device according to claim 1, wherein a plurality of contacts is formed on the substrate and the contacts comprise:

at least one first contact disposed on the active area units and between two adjacent ones of the first word lines; and at least one second contact disposed on the active area units and between adjacent ones of the first word lines and the at least one second word line, wherein a width of the second contact in the first direction is greater than a width of the first contact in the first direction.

3. The method of fabricating a semiconductor device according to claim 2, wherein a part of the active area units connects to the second active area, and the contacts do not contact the part of the active area units.

4. The method of fabricating a semiconductor device according to claim 3, wherein the at least one second word line directly contacts an end portion of the part of the active area units.

5. The method of fabricating a semiconductor device according to claim 2, further comprising:

forming a plurality of contact openings on the substrate, to align with the active area units respectively; and forming the contacts in the contact openings respectively.

6. The method of fabricating a semiconductor device according to claim 5, wherein a sidewall of a part of the contact openings is vertically aligned with an end portion of a part of the active area units.

7. The method of fabricating a semiconductor device according to claim 1, wherein a part of the active area units has one end directly in contact with the at least one second word line, and another end directly in contact with the second active area.

* * * * *